United States Patent
Nakamura

(12) United States Patent (10) Patent No.: US 8,141,243 B2
Nakamura (45) Date of Patent: Mar. 27, 2012

(54) METHOD OF MANUFACTURING CIRCUIT BOARD

(75) Inventor: Takuya Nakamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 979 days.

(21) Appl. No.: 12/043,272

(22) Filed: Mar. 6, 2008

(65) Prior Publication Data

US 2008/0218983 A1 Sep. 11, 2008

(30) Foreign Application Priority Data

Mar. 8, 2007 (JP) ................................. 2007-058596

(51) Int. Cl.
*H01K 3/10* (2006.01)
(52) U.S. Cl. .............................. 29/852; 29/846; 174/262
(58) Field of Classification Search .................. 174/262; 257/621, 698; 438/612, 618, 622, 637, 667, 438/977; 29/846, 852, 853
See application file for complete search history.

(56) References Cited

U.S. PATENT DOCUMENTS 5,447,871 A * 9/1995 Goldstein ..................... 438/667
6,841,849 B2 * 1/2005 Miyazawa ..................... 257/621

FOREIGN PATENT DOCUMENTS

| JP | 2004-228598 | 8/2004 |
| JP | 2005-072596 | 3/2005 |
| JP | 2005-191255 | 7/2005 |

* cited by examiner

*Primary Examiner* — Donghai D. Nguyen
(74) *Attorney, Agent, or Firm* — SNR Denton US LLP

(57) ABSTRACT

A method of manufacturing a circuit board including forming a plurality of first holes in a semiconductor substrate, each of the first holes being opened toward a front surface of the semiconductor substrate, filling a bottom side of the plurality of first holes with an insulating layer, filling the first holes filled with the insulating layer on the bottom side thereof with a first electro-conductive layer, polishing the semiconductor substrate from the back surface thereof until the respective insulating layers filled in the plurality of first holes are exposed, and forming a second hole in each of the exposed insulating layers so as to reach the first electro-conductive layer, and forming a second electro-conductive layer by filling each second hole with the second electro-conductive layer to connect the first electro-conductive layer.

2 Claims, 10 Drawing Sheets

US 8,141,243 B2

METHOD OF MANUFACTURING CIRCUIT BOARD

BACKGROUND OF THE INVENTION

1. Field of the Invention

The present invention relates to a method of manufacturing a circuit board and the circuit board, and in particular, to a method of manufacturing a circuit board having an electro-conductive layer extended through a semiconductor substrate, and the circuit board.

2. Description of Related Art

As a result of expanded capacity of memory and more advanced functionalization of LSI, LSI chips having a plurality of semiconductor chips stacked therein have been developed (see Japanese Unexamined Patent Application Publications No. 2004-228598 (hereinafter referred to as "Patent Document 1") and No. 2005-072596 (hereinafter referred to as "Patent Document 2"), for example). In the stacked chips at present, connection between the semiconductor chips is established by forming through-holes in a silicon (Si) substrate, filling the through-holes with an electro-conductive layer, and using fine bumps. Contact with the electro-conductive layer in the through-holes herein is established by adopting a method of carving out the electro-conductive layer by back grinding (BGR) (see Japanese Unexamined Patent Application Publication No. 2005-191255 (hereinafter referred to as "Patent Document 3", for example), or a method of etching back the Si substrate from the back surface so as to expose the electro-conductive layer.

A known method of manufacturing a circuit board will be explained, referring to FIG. 6A to FIG. 10.

First, as shown in FIG. 6A, a $SiO_2$ film 12' serving as a hard mask is formed on a semiconductor substrate 11 composed of a Si wafer having elements such as transistors. Next, a resist pattern $R_1$' for forming through-holes in the semiconductor substrate 11 is formed on the $SiO_2$ film 12' by an existing photolithographic technique.

Next, as shown in FIG. 6B, the $SiO_2$ film 12' (see FIG. 6A) is patterned through the resist pattern $R_1$' used as a mask, to thereby form a hard mask 12. Next, a plurality of holes 13' are formed in the semiconductor substrate 11 as being opened toward the surface thereof, by etching through the resist pattern $R_1$' and the hard mask 12 used as masks. In this process, variation in depth of the holes 13' as large as 3 μm or more may be generated over the surface of the semiconductor substrate 11. This appears herein that the holes 13' formed in the edge portion of the semiconductor substrate 11 are shallower by 3 μm or around than the holes 13' formed in the center portion, wherein the shallowest hole 13' is denoted as a hole 13a', and the deepest hole 13' is denoted as a hole 13b'. Thereafter, the resist pattern $R_1$' is removed.

Next, as shown in FIG. 7D, an insulating film 14 composed of $SiO_2$ is formed on the hard mask 12 by chemical vapor deposition (CVD), so as to cover the inner wall of the holes 13'.

Then, as shown in FIG. 7E, a barrier film 15a, showing blocking performance against diffusion of Cu to be filled later in the holes 13', is formed on the insulating film 14 so as to cover the inner walls of the holes 13' having the insulating film 14 preliminarily formed thereto. Next, a Cu layer 15b is formed on the barrier film 15a so as to fill up the holes 13' having the barrier film 15a preliminarily formed therein. By this process, the holes 13' are filled with a first electro-conductive layer 15 composed of the barrier film 15a and the Cu layer 15b.

Next, as shown in FIG. 7F, the first electro-conductive layer 15 is removed by chemical mechanical polishing (CMP) until the surface of the insulating film 14 is exposed. Thereafter, although not shown here, an interlayer insulating layer is formed on the first electro-conductive layer 15 and the insulating film 14, and interconnections are formed.

Next, as shown in FIG. 8G, the back surface of the semiconductor substrate 11 is polished. In this exemplary case, the back surface of the semiconductor substrate 11 is polished until the surface of the insulating film 14 is exposed. The insulating film 14 covers the first electro-conductive layer 15 formed in the shallowest holes 13a' formed in the edge portion. In this process, the first electro-conductive layer 15 in the holes 13' differed in the depth from the holes 13a' by the thickness of the insulating film 14 or larger, is exposed and polished. For example, in the deepest holes 13b' formed in the center portion, also Cu layer 15b is exposed and polished.

Next, as shown in FIG. 8H, the semiconductor substrate 11 is selectively etched from the back surface, so as to allow the first electro-conductive layer 15 covered with the insulating film 14 in the holes 13a' to project out from the back surface of the semiconductor substrate 11. In this process, the first electro-conductive layer 15 in the holes 13, differed in the depth from the holes 13a' by the thickness of the insulating film 14 or larger, are projected to be exposed. Thereafter, as shown in FIG. 8I, an insulating film 16 composed of $SiO_2$ is formed on the back surface of the semiconductor substrate 11, so as to cover the projections.

FIG. 9J shows an enlarged view of essential portions of the shallowest hole 13a' formed in the edge portion and the deepest hole 13b' formed in the center portion. As illustrated in the drawing, the insulating film 16 is removed by CMP, until the surface of the first electro-conductive layer 15 in the hole 13a' is exposed, more specifically until the surface of the barrier film 15a is exposed. In the hole 13b' herein, the Cu layer 15b is exposed.

Next, as shown in FIG. 9K, a barrier film 17a is formed on the back surface of the semiconductor substrate 11 as well as on the first electro-conductive layer 15. Next, as shown in FIG. 9L, a resist pattern R2' is formed on the barrier film 17a, and as shown in FIG. 10, the barrier film 17a is patterned by etching through the resist pattern $R_2$' (see FIG. 9L) used as a mask. Thereafter, a Cu layer 17b is formed on the barrier film 17a, to thereby form a rear interconnect composed of the second electro-conductive layer 17 having the barrier film 17a and the Cu layer 17b stacked therein.

As described in the above, a circuit board having through-hole electrodes composed of the first electro-conductive layer 15 in the semiconductor substrate 11 is formed.

SUMMARY OF THE INVENTION

However, according to the method of manufacturing a circuit board as explained referring to FIG. 6A to FIG. 10, the semiconductor substrate 11 is polished from the back surface thereof, as deep as the thickness of the first electro-conductive layer 15 in the shallowest holes 13a' formed in the semiconductor substrate 11, so that the first electro-conductive layer 15 formed in the holes 13a' other than the holes 13' is polished. As a consequence, the electro-conductive material may diffuse from the first electro-conductive layer 15 into the semiconductor substrate 11, and thereby leakage of current may occur. In addition, the holes 13a' are adjusted to a target depth to meet the thickness of the first electro-conductive layer 15 formed in the holes 13a', so that the other holes 13' are formed deeper than the target depth. As a result, voids or the like, ascribable to insufficient filling with the Cu layer 15b, are likely to occur, which leads to cause contact failure.

Accordingly, it is desirable to provide a circuit board capable of preventing diffusion of an electro-conductive material into a semiconductor substrate, and of suppressing insufficient filling of the holes formed in the semiconductor substrate with the electro-conductive layer, and a method of manufacturing the circuit board.

In accordance with an aspect of the present invention, there is provided a method of manufacturing a circuit board, including the steps of: forming a plurality of first holes in a semiconductor substrate, each of the first holes being opened toward a front surface of the semiconductor substrate; filling a bottom surface of the plurality of first holes with an insulating layer; filling the first holes filled with the insulating layer on the bottom side thereof with a first electro-conductive layer; polishing the semiconductor substrate from a back surface thereof until the respective insulating layers filled in the plurality of first holes are exposed; and forming a second hole in each of the exposed insulating layers so as to reach the first electro-conductive layer, and forming a second electro-conductive layer by filling each second hole with the second electro-conductive layer to connect the first electro-conductive layer.

In accordance with another aspect of the present invention, there is provided to a circuit board manufactured by the above-described method, wherein the circuit board has a plurality of first holes formed in a semiconductor substrate so as to extend therethrough; insulating layers formed on a back surface of the semiconductor substrate in the plurality of first holes, the insulating layers between the back surface and the first holes being differed in thickness; second holes formed in the insulating layers to communicate with the first holes; and an electro-conductive layer formed in the first holes and the second holes to extend through the semiconductor substrate.

According to the method of manufacturing a circuit board, the semiconductor substrate is polished from the back surface until the respective insulating layers filled in the bottom side of a plurality of first holes formed in the semiconductor substrate are exposed, the second holes respectively reaching the first electro-conductive layers are formed in the respective insulating layers, and the second electro-conductive layers are filled in the second holes to connect to the first electro-conductive layers, so that the first electro-conductive layers are not be polished, even if the first holes vary in the depth. Accordingly, the electro-conductive material may successfully be prevented from diffusing from the first electro-conductive layers toward the semiconductor substrate. When the semiconductor substrate is polished from the back surface thereof until the surface of the insulating layer in the deepest first hole of the plurality of the first holes is exposed, and the semiconductor substrate and the insulating layer are polished from the back surface to as deep as the thickness of the insulating film, the deepest first holes having the insulating layer formed therein on the bottom side thereof may be adjusted to a target depth. As a consequence, any other first holes will be formed only to depth shallower than the target depth, and may correspondingly suppress insufficient filling with the first electro-conductive layers.

As has been explained in the above, according to the method of manufacturing a circuit board and the circuit board, diffusion of an electro-conductive material from the first electro-conductive layer to the semiconductor substrate can be suppressed, and thereby leakage of current due to the diffused material can be prevented. In addition, because the insufficient filling with the first electro-conductive layers may be suppressed, the contact failure can also be prevented.

DETAILED DESCRIPTION OF EMBODIMENTS

Figure 1A:
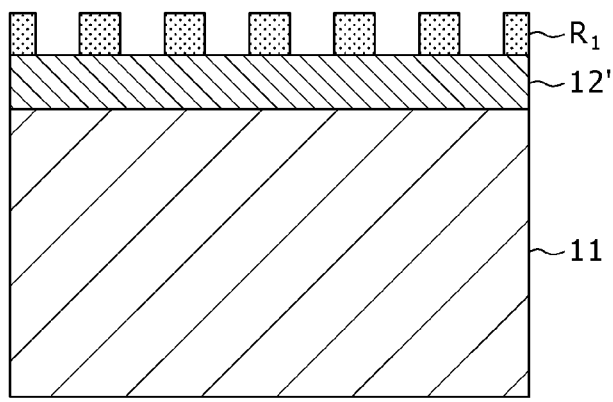
FIGS. 1A to 1C are first sectional views explaining a method of manufacturing a circuit board according to an embodiment of the present invention.

Paragraphs below will detail an embodiment of the present invention, referring to the attached drawings.

An exemplary embodiment according to a method of manufacturing a circuit board of the present invention will be explained, referring to process-wise sectional views in FIG. 1A to FIG. 5. In the embodiment, configurations of the circuit board will be explained according to the order of steps of manufacturing. Any constituents in common with those explained in the Description of Related Art will be explained using the same reference numerals.

First as shown in FIG. 1A, a semiconductor substrate 11 of 700 μm thick, for example, having elements such as transistors formed thereon, is provided. On the semiconductor substrate 11, a $SiO_2$ film 12' which serves as a hard mask is formed. Next, on the $SiO_2$ film 12', a resist pattern $R_1$ for forming through-holes in the semiconductor substrate 11 is formed by a general photolithographic technique.

Figure 1B:
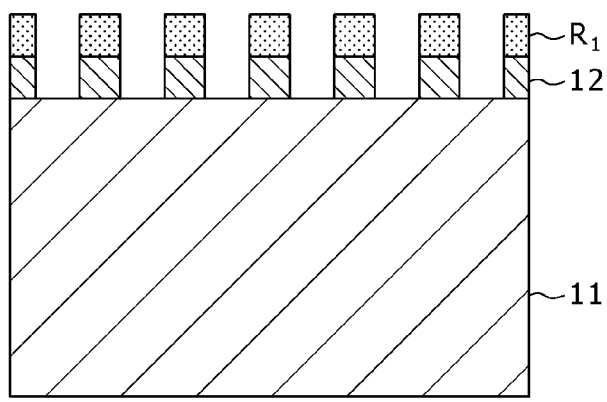
Figure 1C:
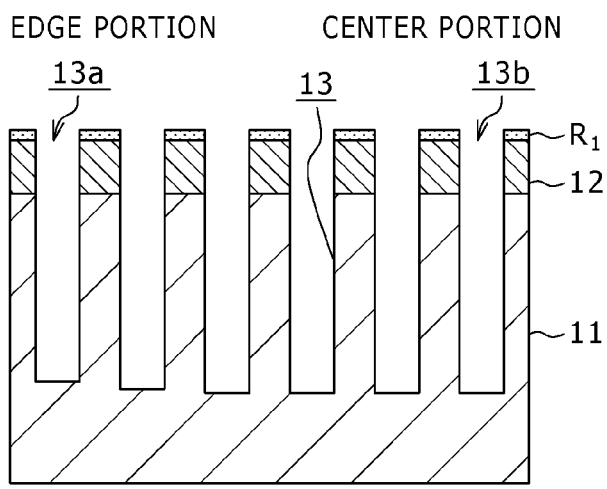

Next, as shown in FIG. 1B, the $SiO_2$ film 12' (see FIG. 1A) is patterned through the resist pattern $R_1$ used as a mask, to thereby form a hard mask 12.

Next, a plurality of first holes 13, having depth of 20 μm to 150 μm, and a diameter of 1 μm to 20 μm, are formed in the semiconductor substrate 11 as being opened toward the surface thereof, by etching through the resist pattern $R_1$ and the hard mask 12 used as masks. In this process, variation in depth of the holes 13 as large as 3 μm or more, ascribable to a limited accuracy of the lithographic technique, may be generated over the surface of the semiconductor substrate 11. This appears herein that the holes 13 formed in the edge portion of the semiconductor substrate 11 are shallower by 3 μm or around than the holes 13 formed in the center portion, wherein the shallowest hole 13 is denoted as a hole 13a, and the deepest hole 13 is denoted as a hole 13b. Thereafter, the resist pattern $R_1$ is removed.

Figure 2A:
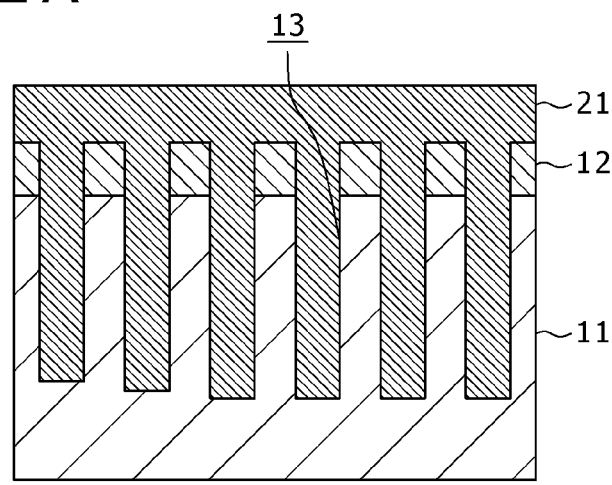
FIGS. 2D to 2F are second sectional views explaining a method of manufacturing a circuit board according to an embodiment of the present invention.
Figure 2B:
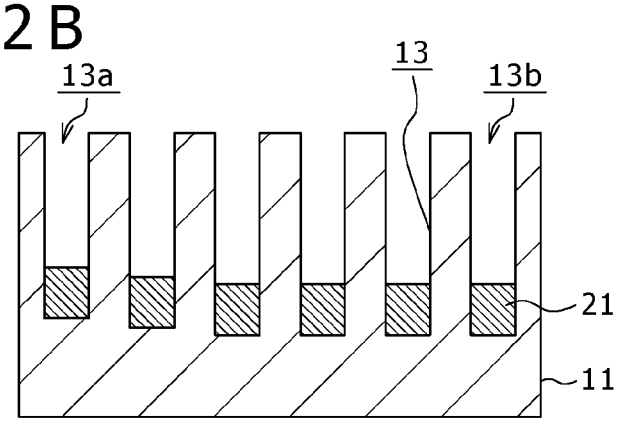
Figure 2C:
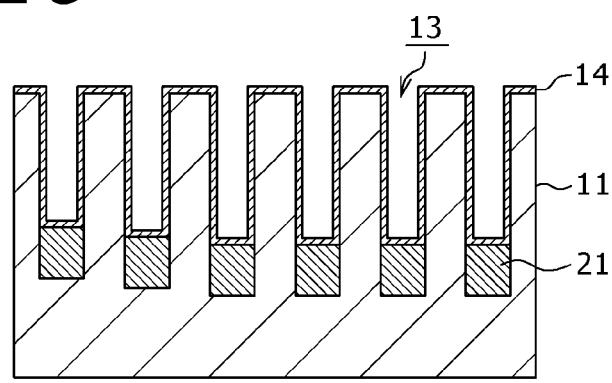

Next, as shown in FIG. 2D, an insulating film 21 composed of $SiO_2$ is formed by plasma CVD, for example, on the hard mask 12 so as to fill up the first holes 13. The insulating layer 21 functions as a stopper for allowing detection of an end point of polishing, when the semiconductor substrate 11 is polished later from the back surface thereof. Exemplary conditions in this process involve use of a mixed gas of monosilane ($SiH_4$) and nitrous oxide ($N_2O$) as a source gas, at 300° C. to 400° C.

Although the insulating layer 21 herein is exemplified as being composed of $SiO_2$, the insulating layer by an embodiment of the present invention is not limited thereto, and allows use of silicon nitride (SiN) or organic insulating materials. For an exemplary case where the insulating layer 21 is composed of SiN, exemplary conditions involve use of a mixed gas of monosilane ($SiH_4$) and ammonia ($NH_3$) at 300° C. to 400° C. If the insulating layer 21 is composed of an organic insulating material, the insulating layer 21 may be formed by a coating method such as spin coating, printing or the like.

Next, as shown in FIG. 2E, the insulating layer 21 is etched back by wet etching, for example, so as to leave the insulating layers 21 only at the bottom side of the first holes 13. Detection of the end point of etching in this process is managed on the time basis. By the wet etching, the hard mask 12 composed of $SiO_2$ formed by the same manner of the insulating layer 21 is removed.

The insulating layers 21 herein are allowed to remain to a thickness larger than variation in depth of the first holes 13. More specifically, they are remained to as thick as larger than difference between the shallowest first holes 13a and the deepest first holes 13b. However, too large thickness of the insulating layers 21 may increase an aspect ratio of the second holes formed later in the insulating layer 21 to have diameters smaller than those of the first holes 13, and may consequently induce insufficient filling of the second holes with the second electro-conductive layers, so that thickness of the insulating layer 21 is preferably 10 μm or below. The insulating layer 21 herein is remained to a thickness of 3 μm or above and 5 μm or below.

As described in the above, the first electro-conductive layers filled in the first holes 13 are not exposed by virtue of provision of the insulating layers 21 at the bottom portions of the first holes 13, even if the semiconductor substrate 11 is polished from the back surface until the respective insulating layer 21 are exposed, so that the first electro-conductive layers are prevented from being polished. By virtue of this configuration, diffusion of the electro-conductive material from the first electro-conductive layers to the semiconductor substrate 11 can be prevented.

Although the description herein dealt with the case where the hard mask 12 is removed in the etchback process of the insulating layer 21, the hard mask 12 may also be composed of a material capable of ensuring etching selectivity with respect to the insulating layer 21, and may be left unremoved.

Next, as shown in FIG. 2F, the insulating film 14 is formed on the semiconductor substrate 11 by CVD, for example, so as to cover the inner walls of the plurality of first holes 13 having the insulating layers 21 formed on the bottom side. The insulating film 14 preferably has a high density, in view of ensuring appropriate isolation property between the semiconductor substrate 11 and the first electro-conductive layers formed in the first holes 13. Besides the above-described $SiO_2$, SiN may be used as a material constituting the insulating film 14.

Although the insulating film 14 in this embodiment is formed so as to cover the inner walls of the first holes 13, after the insulating layers 21 are formed in the first holes 13, the insulating film 14 may be formed so as to cover the inner walls of the first holes before the insulating layer 21 is formed. In this case, it is preferable to form the insulating layer 21 using a material capable of ensuring an etching selectivity against the insulating film 14 covering the inner walls of the first holes 13, because the insulating film 14 may be left unremoved when the insulating layer 21 is etched back. For example, if the insulating layer 21 is formed of an organic insulating material, and the insulating film 14 is formed of an inorganic insulating material, the insulating film 14 may be left unremoved even if the insulating layer 21 is etched back. It is to be noted that, if the insulating film 14 is formed prior to formation of the insulating layer 21, and the insulating film 14 is removed during etchback of the insulating layer 21, the insulating film 14 is formed again, after the etchback of the insulating layer 21, so as to cover the inner walls of the first holes 13.

Figure 3A:
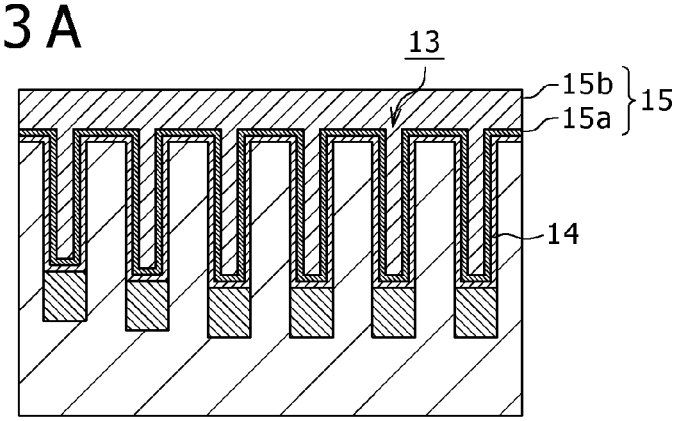
FIGS. 3G to 3J are third sectional views explaining a method of manufacturing a circuit board according to an embodiment of the present invention.
Figure 3B:
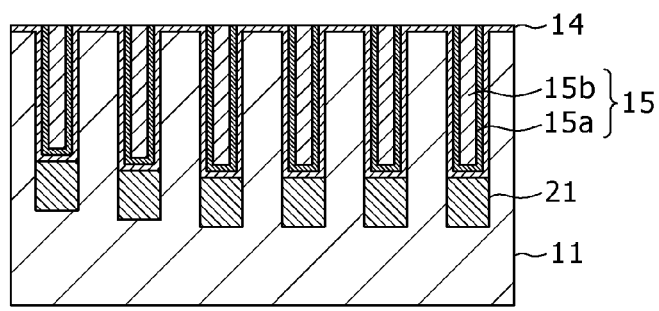
Figure 3C:
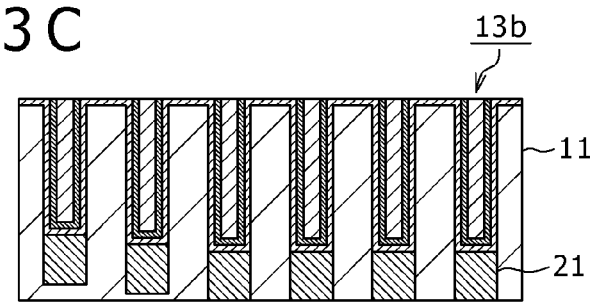
Figure 3D:
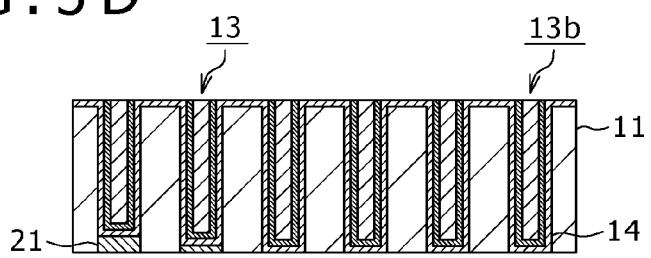

Next, as shown in FIG. 3G, the barrier film 15a composed of tantalum nitride (TaN), capable of blocking diffusion of Cu filled later in the first holes 13, is formed so as to cover the inner walls of the first holes 13 having the insulating film 14 preliminarily formed thereto, on the insulating films 14. Next, the Cu layer 15b is formed so as to fill the first holes 13 having the barrier film 15a preliminarily formed thereto, on the barrier film 15a. As a consequence, the first holes 13 are filled up by the first electro-conductive layer 15 composed of the barrier film 15a and the Cu layer 15b. The first holes 13, filled up herein with the Cu layer 15b, may alternatively be filled up also with a tungsten (W) layer, or with an aluminum (Al) layer. When the Al layer is used, no special problem would occur even if the barrier film showing a diffusion blocking performance is not formed.

Next, as shown in FIG. 3H, the first electro-conductive layer 15 is removed by CMP, for example, until the surface of the insulating film 14 is exposed. Thereafter, although not illustrated herein, an interlayer insulating layer is formed on the first electro-conductive layer 15 and the insulating film 14, and interconnects are formed.

Next, the semiconductor substrate 11 is polished from the back surface thereof, until the respective insulating layers 21 filled in the plurality of first holes 13 are exposed. The polishing design adopted herein is two-stage polishing, for example. First, as shown in FIG. 3I, in the first stage of polishing, the back surface of the semiconductor substrate 11 is polished until the surface of the insulating layer 21 formed in the deepest first holes 13b formed at the center portion is exposed, using this insulating layer 21 as a stopper. Detection of the end point in this process is managed on the time basis, wherein the thickness of the semiconductor substrate 11 is reduced to 20 μm to 150 μm.

Next, as shown in FIG. 3J, in the second stage of polishing, the insulating layer 21 is polished to as deep as the thickness thereof, and the semiconductor substrate 11 and the insulating layer 21 are further polished. Detection of the end point in this process is managed on the time basis. As a consequence, the deepest first holes 13b now appear as exposing the surface of the insulating film 14 covering the first electro-conductive layer 15, and the first holes 13 other than the first holes 13b appear as having the insulating layer 21 exposed to the back surface of the semiconductor substrate 11, on the bottom side of the first holes 13. Thicker insulating layer 21 remains in shallower first hole 13. Accordingly, the deepest first holes having the insulating layers 21 formed therein on the bottom sides thereof may be adjusted to a target depth, and any other first holes will be formed only to depth shallower than the target depth, so that insufficient filling with the first electro-conductive layers can correspondingly be suppressed.

The exemplary case of two-stage polishing, using the insulating layers formed in the bottom sides of the deepest first holes 13b as the stopper, has been described, wherein embodiments of the present invention is not limited thereto, and it is good enough that the semiconductor substrate 11 and the insulating layer 21 are polished from the back surface thereof until the respective insulating layers 21 filled in a plurality of the first holes 13 are exposed.

Figure 4A:
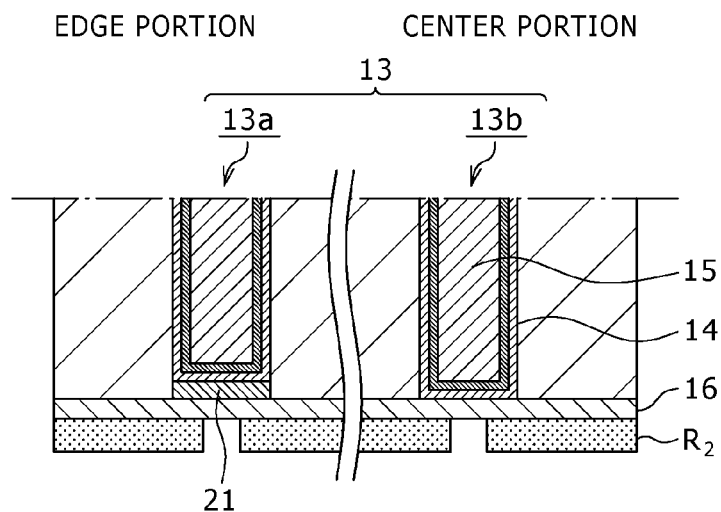
FIGS. 4K to 4M are fourth sectional views explaining a method of manufacturing a circuit board according to an embodiment of the present invention.
Figure 4B:
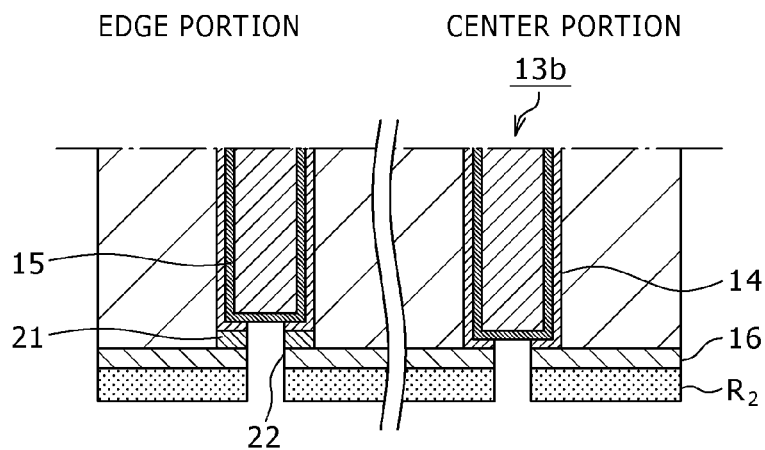
Figure 4C:
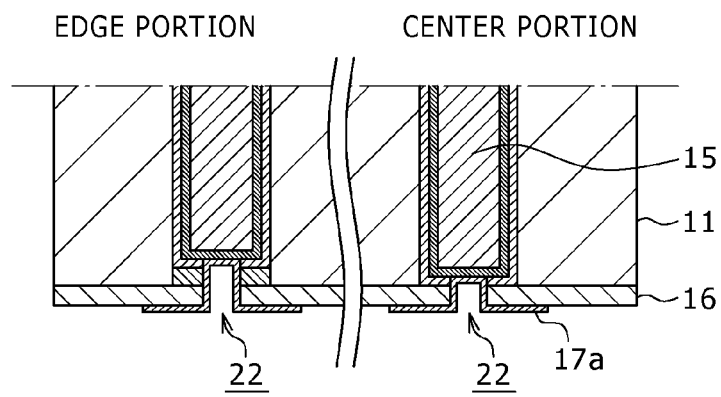
Figure 5:
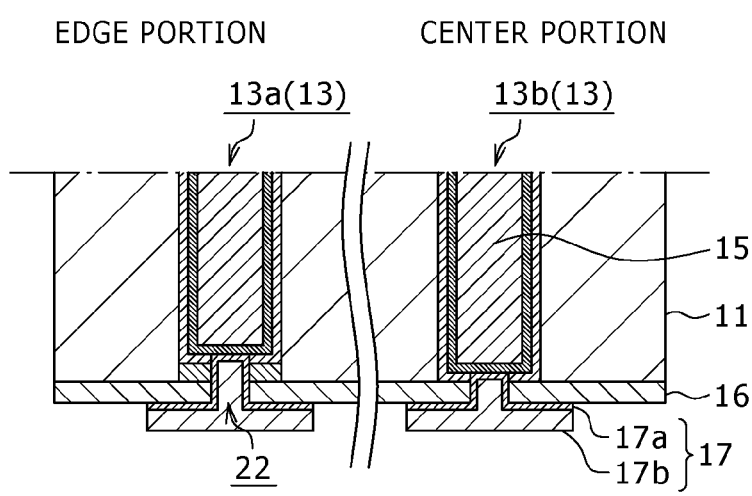
FIG. 5 is a fifth sectional view explaining a method of manufacturing a circuit board according to an embodiment of the present invention.
Figure 6A:
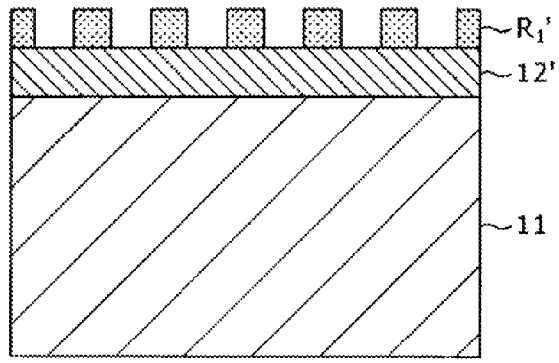
FIGS. 6A to 6C are first sectional views explaining a known method of manufacturing a circuit board.
Figure 6B:
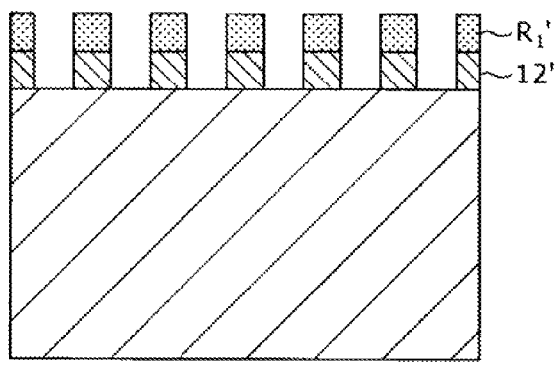
Figure 6C:
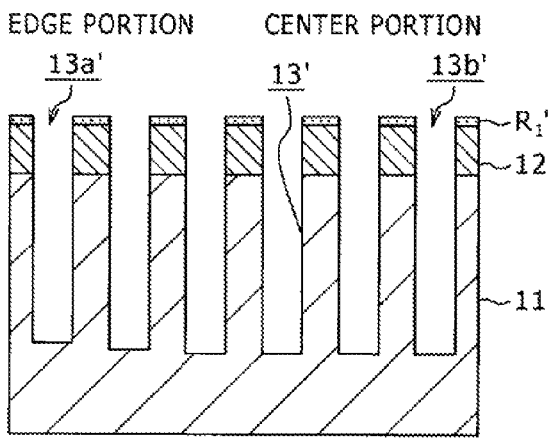
Figure 7A:
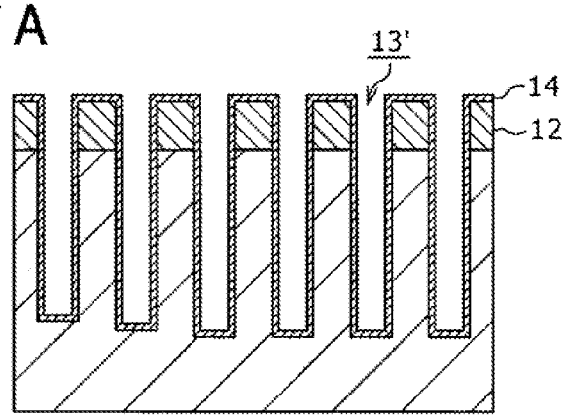
FIGS. 7D to 7F are second sectional views explaining a known method of manufacturing a circuit board.
Figure 7B:
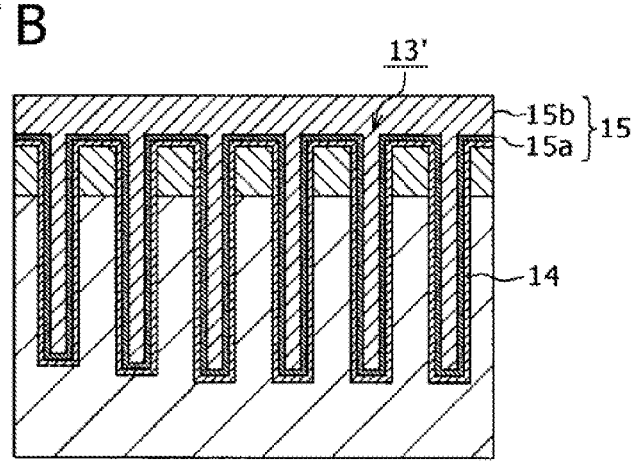
Figure 7C:
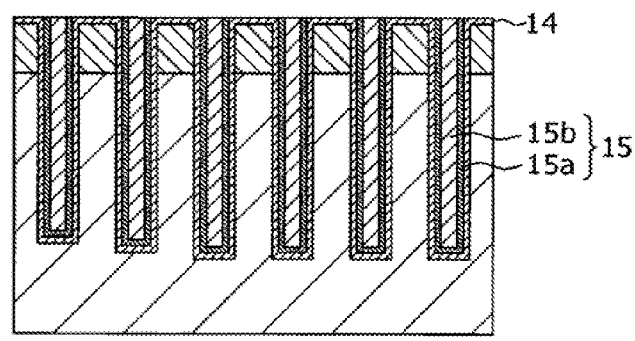
Figure 8A:
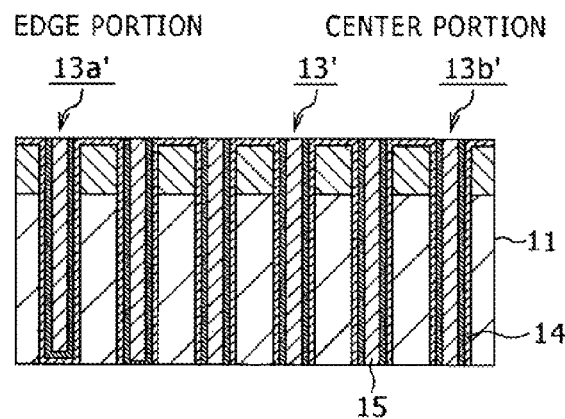
FIGS. 8G to 8I are third sectional views explaining a known method of manufacturing a circuit board.
Figure 8B:
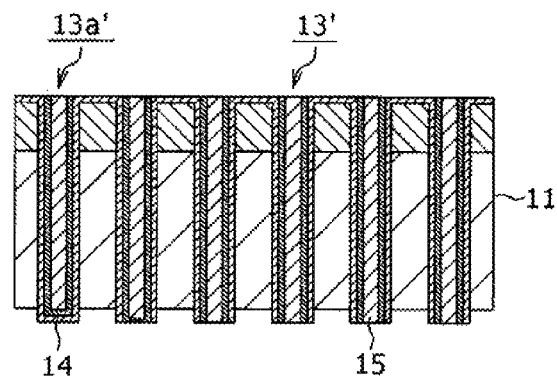
Figure 8C:
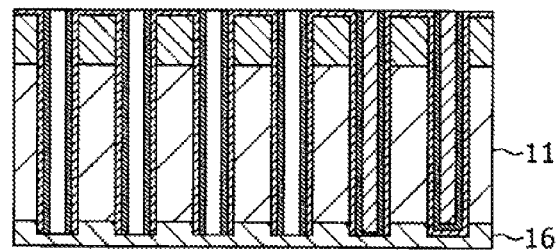
Figure 9A:
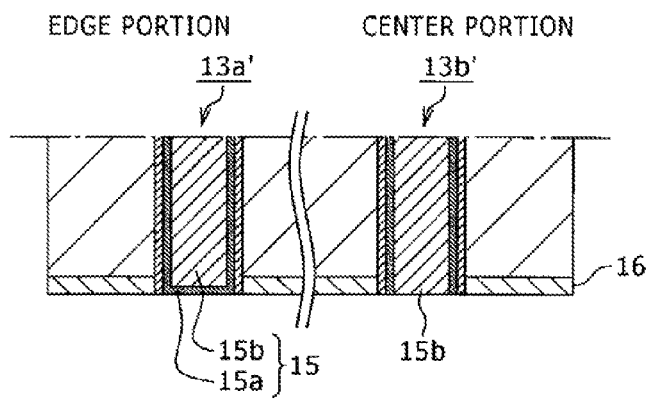
FIGS. 9J to 9L are fourth sectional views explaining a known method of manufacturing a circuit board.
Figure 9B:
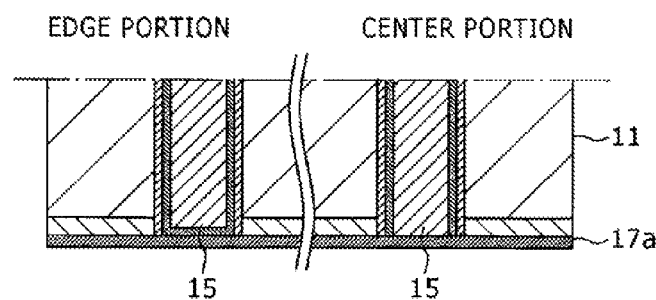
Figure 9C:
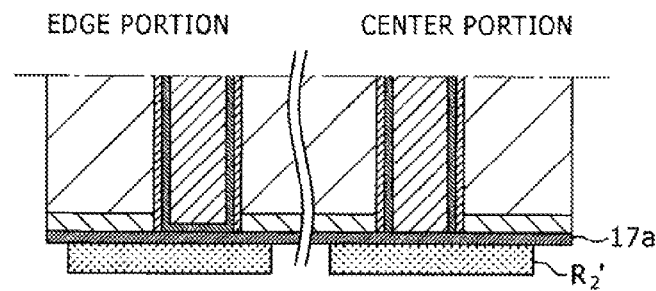
Figure 10:
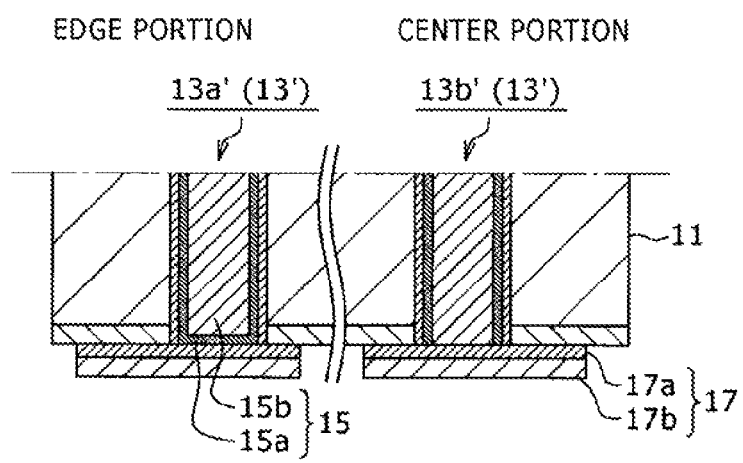
FIG. 10 is a fifth sectional view explaining a known method of manufacturing a circuit board.

FIG. 4K shows an enlarged view of essential portions of the shallowest hole 13a formed in the edge portion and the deepest hole 13b formed in the center portion. As illustrated in the drawing, the insulating film 16 composed of $SiO_2$, for example, is formed on the back surface of the semiconductor substrate 11 including the surface of the insulating layer 21 and the and insulating film 14. Thereafter, the resist pattern $R_2$ is formed on the insulating film 16.

Next, as shown in FIG. 4L, second holes 22 are formed in the insulating film 16, the insulating layer 21 and the insulating film 14, so as to reach the first electro-conductive layers 15, by etching through the resist pattern $R_2$ used as a mask. It is to be noted that, on the bottom side of the deepest first hole 13b, the second hole 22 is formed in the insulating film 16 and insulating film 14, because insulating layer 21 does not remain. Because the second holes 22 are formed so as to penetrate the insulating layers 21 formed in the first holes 13, the second holes 22 are formed smaller in diameter than the first holes 13. Thereafter, the resist pattern $R_2$ is removed.

Next, as shown in FIG. 4M, a barrier film 17a typically composed of TaN is formed to cover the inner walls of the second holes 22. In this process, the barrier film 17a is brought into contact with the first electro-conductive layer 15 at the bottom of the second holes 22. Next, a resist pattern (not illustrated) is formed on the barrier film 17a, and the barrier film 17a is patterned by etching through the resist pattern used as a mask.

Thereafter, the Cu layer 17b is formed on the barrier film 17a by electroless plating, for example, to fill up the second holes 22 having the barrier film 17a formed therein, and thereby the second holes 22 are filled with the electro-conductive layer 17 composed of the barrier film 17a and the Cu layer 17b.

In this way, a circuit board having through-hole electrodes composed of the first electro-conductive layer 15 and the second electro-conductive layer 17 formed in the semiconductor substrate 11 is formed. The circuit board in this case has a plurality of first holes 13 formed in the semiconductor substrate 11 so as to extend therethrough; the insulating layers 21 formed in the plurality of first holes 13 on the back surface of the semiconductor substrate 11, the thickness of which differ; the second holes 22 formed in the insulating layers 21 to communicate with the first holes 13; and the first electro-conductive layer 15 and the second electro-conductive layer 17 formed in the first holes 13 and the second holes 22 to extend through the semiconductor substrate 11.

According to the method of manufacturing a circuit board, the semiconductor substrate 11 is polished from the back surface until the respective insulating layers 21 filled in the bottom side of a plurality of first holes 13 formed in the semiconductor substrate 11 are exposed, the second holes 22 respectively reaching the first electro-conductive layers 15 are formed in the respective insulating layers 21, and the second electro-conductive layers 17 are filled in the second holes 22 to connect to the first electro-conductive layers 15, so that the first electro-conductive layers 15 are not polished, even if the first holes 13 vary in the depth. Accordingly, the electro-conductive material may successfully be prevented from diffusing from the first electro-conductive layers 15 toward the semiconductor substrate 11. Leakage of current ascribable to diffusion of the electro-conductive material into the semiconductor substrate 11 may thus be prevented.

Because the semiconductor substrate 11 is polished from the back surface thereof until the surface of the insulating layer 21 in the first holes 13b deepest of all is exposed, and the semiconductor substrate 11 and the insulating layer 21 are polished from the back surface to as deep as the thickness of the insulating film 21, the deepest first holes 13b having the insulating layer 21 formed therein on the bottom side thereof may be adjusted to a target depth. As a consequence, any other first holes 13 will be formed only to depth shallower than the target depth, and may correspondingly suppress insufficient filling with the first electro-conductive layers 15. Contact failure typically ascribable to formation of voids may therefore be prevented.

The above-described embodiment dealt with the case where the first holes 13 are formed in the semiconductor substrate 11 having the transistors preliminarily formed thereon, whereas embodiments of the present invention is also applicable to the case where the transistors are formed after the first holes 13 are filled with the first electro-conductive layers 15.

It should be understood by those skilled in the art that various modifications, combinations, sub-combinations and alternations may occur depending on design requirements and other factors insofar as they are within the scope of the appended claims or equivalents thereof.

The present application claims benefit of priority of Japanese patent Application No. 2007-58596 filed in the Japanese Patent Office on Mar. 8, 2007, the entire contents of which are incorporated herein by reference.

What is claimed is:

1. A method of manufacturing a circuit board comprising:
    forming a plurality of first holes in a semiconductor substrate, each of the first holes being open toward a front surface of the semiconductor substrate;
    filling a bottom side of the plurality of first holes with an insulating layer;
    filling the first holes filled with the insulating layer on the bottom side thereof with a first electro-conductive layer;
    polishing the semiconductor substrate from a back surface thereof until the respective insulating layers filled in the plurality of first holes are exposed; and
    forming a second hole in each of the exposed insulating layers so as to reach the first electro-conductive layer, and forming a second electro-conductive layer by filling each second hole with the second electro-conductive layer to connect the first electro-conductive layer.

2. The method of manufacturing a circuit board as claimed in claim 1, wherein the semiconductor substrate polishing step comprises:
    polishing the semiconductor substrate from the back surface thereof until a surface of the insulating layer in the deepest first hole of the plurality of the first holes is exposed, and then
    polishing the insulating layer and the semiconductor substrate from the back surface to as deep as thickness of the insulating film.

* * * * *